United States Patent
Kurrer et al.

(10) Patent No.: US 6,266,253 B1
(45) Date of Patent: Jul. 24, 2001

(54) RACK SYSTEM FOR INSERTION OF ELECTRICAL PRINTED CIRCUIT BOARD ASSEMBLIES USING CENTERING AND CONTACT ELEMENTS

(75) Inventors: Siegfried Kurrer, Nuremberg; Ernst Billenstein, Burgbernheim; Kurt-Michael Schaffer, Eckental, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/643,752

(22) Filed: Aug. 23, 2000

Related U.S. Application Data

(63) Continuation of application No. PCT/DE99/00395, filed on Feb. 10, 1999.

(30) Foreign Application Priority Data

Feb. 23, 1998 (DE) .............................. 198 07 555

(51) Int. Cl.[7] ................. H05K 5/00; H05K 7/14
(52) U.S. Cl. ............. 361/796; 361/797; 361/801; 361/802; 361/759; 439/64; 439/152
(58) Field of Search ................ 361/724, 726, 361/727, 752, 756, 759, 796–802; 439/64, 152–160

(56) References Cited

U.S. PATENT DOCUMENTS 5,587,888 * 12/1996 Joist ...................................... 361/802
5,629,836 * 5/1997 Wright ................................. 361/755

FOREIGN PATENT DOCUMENTS

| 90 12 844 | 1/1991 | (DE) . |
| 579 859 A1 | 1/1994 | (EP) . |
| WO 93/03594 | 2/1993 | (WO) . |
| WO 96/42187 | 12/1996 | (WO) . |
| WO 97/49270 | 12/1997 | (WO) . |

OTHER PUBLICATIONS

Die ganze Elektronick'94, Burklin Catalogue, 1994, 3 Pages.

* cited by examiner

Primary Examiner—Jayprakash N. Gandhi
(74) Attorney, Agent, or Firm—Sughrue, Mion, Zinn, Macpeak & Seas, PLLC

(57) ABSTRACT

In a rack system for inserting electrical printed circuit board assemblies, front elements (52,8) for slots are provided with projecting plug-in and withdrawable centering and contact elements (13,49). These elements have associated receiving elements (16,21) composed of electrically conductive material and are mounted with low impedance to a transverse connecting rail (36,38). During an insertion process, the receiving elements and the centering and contact elements come into contact in a centered manner. When inserted, the receiving elements and the centering and contact elements provide a vibration-proof mechanical connection with a high adhesion force and a low-impedance contact with a high current carrying capacity.

28 Claims, 6 Drawing Sheets

RACK SYSTEM FOR INSERTION OF ELECTRICAL PRINTED CIRCUIT BOARD ASSEMBLIES USING CENTERING AND CONTACT ELEMENTS

This is a Continuation of International Application PCT/DE99/00395, with an international filing date of Feb. 10, 1999, the disclosure of which is incorporated into this application by reference.

FIELD OF AND BACKGROUND OF THE INVENTION

The invention relates to a rack system having a mounting rack with slots for the insertion of electrical printed circuit board assemblies using centering and contact elements.

The mounting rack in such a rack system provides volume elements for the insertion of the electrical printed circuit board assemblies. These volume elements are also referred to as slots and are, in general, arranged lying and parallel next to one another. Electrical printed circuit board assemblies can then be inserted into these slots. Thereafter, the electrical printed circuit board assemblies lie parallel next to one another, too.

By way of example, FIG. 1, in addition to including certain inventive features discussed below, shows a standard, basic configuration of a mounting rack 50. The space for accommodating the printed circuit board assemblies is bounded by transverse connecting rails, which are arranged on opposite sides and composed of electrically conductive material. In the example of FIG. 1, there are two lower transverse connecting rails 36,37, and two opposite, upper transverse connecting rails 38,39. The transverse connecting rails 36,38 bound the front side of the mounting rack 50, i.e., the insertion side 35 for inserting the electrical printed circuit board assemblies. The two transverse connecting rails 37,39 bound the rear side of the mounting rack 50, which can be closed, for example, by a backplane.

The transverse connecting rails 36,37,38,39 can be mounted at the sides of a cubicle, for example inside the cubicle. The embodiment in FIG. 1 has vertical sidewall plates 40,41, to which the transverse connecting rails are laterally screwed. Finally, the top and the bottom of the mounting rack 50 are closed by respective upper and lower covering plates 47,48. Front elements are provided to close the insertion side 35 of the mounting rack 50. These front elements are assigned to the individual slots inside the mounting rack and are adapted to their widths. Furthermore, the front elements can be plugged on and pulled off. This closure capability is independent of whether or not the slot located behind a front element is occupied by an electrical printed circuit board assembly. Thus, on the one hand, empty slots can be closed by a front element that is slid onto the insertion side 35 of the mounting rack 50, much like in the manner of an empty spot closure. On the other hand, the electrical printed circuit board assemblies can be provided with a front element along one edge, so that, once the assemblies are inserted into the mounting rack 50, the front element covers the corresponding slot at the insertion side 35.

The example of FIG. 1 has front elements 52,8 for two slots 44,45, which are located on the left-hand side of the mounting rack 50. By way of example, the front elements include multiple parts. For instance, the front element 8 includes a vertical front panel 9, which is composed of electrically conductive material. Each of the upper and lower faces of the front element 8 includes an end part 10,1 which, as a rule, is likewise composed of an electrically conductive material. By way of example, lever handles 12,2 are rotatably borne at these end parts. These lever handles can be operated by one person, in particular by pivoting movements, so that at least the front element 8 can be inserted and withdrawn in a simple manner.

In the example of FIG. 1, the front element 52 is completely slid onto the slot 44 located behind the front element 52. The front element 52 covers the slot 44 and lies in the plane of the insertion side 35 of the mounting rack 50. By way of example, the front element 8 of the adjacently located slot 45 is firmly connected to a printed circuit board assembly 51. The connection is advantageously made with the aid of both end parts 10,1. For the most part, the printed circuit board assembly has been inserted into the slot 45. After the complete insertion of the assembly into the slot 45, the front element 8 is justified next to the front element 52 and lies in the plane of the insertion side 35, too.

During insertion of the front elements or units, which include the front elements and the electrical printed circuit board assemblies, these elements must be centered in the insertion direction, in particular immediately before they reach the completely inserted state. This avoids an accidental lateral offset, in particular, of the front elements, which would impede the complete insertion of the front elements or, in some circumstances, even prevent such insertion. This centering process is particularly necessary when adjacent slots are already covered by front elements at the insertion side. Therein, while centered as accurately as possible, the front element to be inserted must be moved forward onto the free opening of the respective slot. Furthermore, after the complete insertion of the front elements, the front elements must be secured against becoming detached, in particular if the front element is firmly connected to the electrical printed circuit board assembly located inside the slot. Finally, the front elements must make a reliable electrically conductive contact with the mounting rack, in particular if the front elements and their parts are largely composed of electrically conductive materials. Preferably, the front elements contact the transverse connecting rails of the mounting rack. This results in the front elements being connected to the protective-ground contact of the mounting rack. Therefore, even high fault currents can be dissipated from the front elements to the mounting rack. This makes it possible to trigger mains protection devices, such as load-break disconnectors or residual current devices, at a speed that ensures that personnel are protected.

Various designs are already known for centering and securing a front element.

For instance, European Patent EP 0 579 859 B1 discloses a printed circuit board assembly having guide pins to accurately insert a printed circuit board assembly into a mounting rack. Two guide pins for centering are provided on the outsides of the corner mounting bodies of the printed circuit board assembly. During insertion, the guide pins are supported on the side flanks of the opposite head end of a longitudinal guide rail. In addition, a ground contact pin is arranged between the guide pins. When the printed circuit board assembly is inserted, the ground contact pin enters a coding chamber at the end face of the opposite head end of the longitudinal guide rail. The coding chamber is occupied by a ground contact spring.

Finally, the corner mounting body has a mounting hole for receiving a screw. This screw can be connected to holding means in order to secure the printed circuit board assembly against becoming detached. These holding means are mounted in a transversely running holding slot in the transverse connecting rail. However, this arrangement has the disadvantage that there are four different elements in order to provide the functions "centering", "ground contact" and "security against falling out". A further disadvantage is that the means provided for the ground contact are not adequate for a protective-ground contact. Furthermore, this adversely affects the function of the coding elements and the coding chambers.

WO 96/42187 discloses a front system for a printed circuit board assembly with active/passive switching. For centering, the end part of the printed circuit board assembly has a guide pin, which is provided to engage in an opposite guide hole. In this arrangement too, an additional screw is provided on the end part to secure the printed circuit board assembly against becoming detached. In the inserted state, this screw can be screwed into a threaded rail, which is mounted in a transverse groove inside the opposite transverse connecting rail. Again, this arrangement has the disadvantage of having multiple parts. Furthermore, there are no additional elements provided to make an electrical protective-ground contact between the front element and the transverse connecting rails.

Finally, WO 97/49270 discloses a mounting rack having plug-in assemblies. The plug-in assemblies have front panels that can be centered. A screw, which passes through the front panel, is provided at one end of such a front panel. Furthermore, guide means, which run in the transverse direction, are mounted in the opposite transverse connecting rail. During insertion of a printed circuit board assembly, which is provided with the front panel, into the corresponding mounting rack, the screw makes contact with the guide means. The guide means have a centering region located at the front and a threaded region located at the rear. In one embodiment, the centering region is formed by a centering strip with equidistant centering holes and the threaded region, which is located behind the centering region, is formed by a threaded strip with equidistant threaded holes. This arrangement has the disadvantage that the parts involved have to accurately fit one another.

Furthermore, there are no additional elements provided for electrical protective-ground contacts between the front panel and the transverse connecting rails.

OBJECTS OF THE INVENTION

It is one object of the invention to provide an arrangement having a mounting rack for the insertion of electrical printed circuit boards. This arrangement performs the following functions in a simple and safe manner: centering of a front element of a printed circuit board during insertion into a slot; securing the front element with the printed circuit board assembly against loosening and falling out of the slot; and making protective-ground contacts with the front element of the printed circuit board assembly in the inserted state.

SUMMARY OF THE INVENTION

According to one formulation of the invention, this and other objects are achieved by a rack system that includes a mounting rack with slots for the insertion of electrical printed circuit board assemblies. The mounting rack has at least mutually opposite transverse connecting rails, which are composed of electrically conductive material, in order to bound the slots. Plug-on and pull-off front elements made of electrically conductive material are provided for the slots. These front elements are provided with at least one plug-in and withdrawable centering and contact element. This centering and contact element projects in the direction of an insertion side of the mounting rack. In addition, receiving elements are provided for the plug-in and withdrawable centering and contact elements, which are made of electrically conductive material. Each of the receiving elements is assigned to one slot and, with low impedance, is mounted at a transverse connecting rail on an insertion side of the mounting rack. During a plug-in process, the receiving elements and the plug-in and withdrawable centering and contact elements come into contact in a mechanically centering manner. In the plugged-in state, these elements not only make a vibration-proof mechanical contact having a high adhesion force, but they also make an electrically low-impedance contact having a high current-carrying capacity.

The rack system according to the invention has particular advantages. These advantages are based on the physical design of the centering and contact elements, which are connected to the front elements. Furthermore, these advantages are based on the physical design of the mutually opposite receiving elements as well as on their low impedance contact with the transverse connecting rail. These designs allow for the simultaneous performance of the following three functions: mechanical centering during the insertion or plug-in process, mechanical retention with security against becoming detached in the fully plugged-on or inserted state, and electrically low-impedance contact having a high current-carrying capacity, which satisfies the requirements for protectiveground contacts. In particular, there is no need for any additional screw connections, which, in the conventional arrangements between a front element (connected with an electrical printed circuit board assembly) and a transverse connecting rail, are activated when a front element is in the completely inserted state.

According to a further advantageous embodiment of the rack system according to the invention, connecting means for a permanently electrically low impedance connection of a receiving element to a transverse connecting rail are provided. These may preferably be in the form of a screw connection, which forms a connection with a permanently low impedance and a high current-carrying capacity. Thus, this connection also satisfies the requirements for protective-ground contacts.

In a rack system according to the invention, guide rails are mounted on the transverse connecting rails in order to simplify the process of inserting the printed circuit boards into the slots. Preferably, these guide rails are arranged in pairs opposite to one another. In this case, it is advantageous if, in a slot, the at least one receiving element is arranged on a transverse connecting rail, immediately adjacent to a guide rail. Preferably, the at least one receiving element lies next to the head end of the guide rail. The receiving elements are advantageously in the form of blocks or small bars. In such an overall arrangement, it is particularly advantageous if, for each slot, the at least one receiving element and the associated at least one guide rail are integrally formed from a single component made of electrically conductive material.

In a further particularly advantageous embodiment of the rack system according to the invention, an additional contact means is provided between the receiving element and the centering and contact element. This allows for a further improvement of the mechanical clamping or adhesion as well as the electrical contact between the two elements.

In a first embodiment, the additional contact means is connected to the centering and contact element. The connection is advantageously made by plugging the additional contact means onto the centering and contact element, in particular onto its front contact region. This type of mounting is further simplified if the centering and contact elements are preferably in the form of cylindrical pins and the additional contact means is preferably in the form of a barrel spring with outwardly pointing spring contact laminates. Finally, if the receiving elements have a first entry opening on a side facing the insertion side of the mounting rack, the centering and contact element (which is provided with the additional contact means) of a front element enters this entry opening in a centering manner during the insertion process. The contact means, which is then located inside the first entry opening, allows for improvement of the mechanical adhesion as well as the electrical contact between the centering and contact element and the receiving element.

In a second embodiment, the additional contact means is connected to the receiving element. The connection is advantageously made by the receiving element having the first entry opening for the centering and contact element on the side facing the insertion side of the mounting rack, and by the additional contact means being mounted in a contact area behind the first entry opening. Such a receiving element advantageously has a second entry opening on a side facing away from the insertion side of the mounting rack, for the insertion of the additional contact means into the contact area. On this side facing away from the insertion side of the mounting rack, an additional contact means preferably has means for latching the additional contact means to the receiving element, in particular spread latching claws. These preferably engage in a slot in the receiving element. The mounting of the additional contact means in the receiving element and the latching of this contact means to the receiving element are further assisted if the receiving element is a spring cage with inwardly pointing spring contact laminates.

BRIEF DESCRIPTION OF THE DRAWINGS

The invention and further advantageous refinements of the invention according to the features of the dependent claims are explained in more detail below with the aid of diagrammatic, exemplary embodiments in the drawings, in which:

DETAILED DESCRIPTION OF THE PREFERRED EMBODIMENTS

Figure 1:
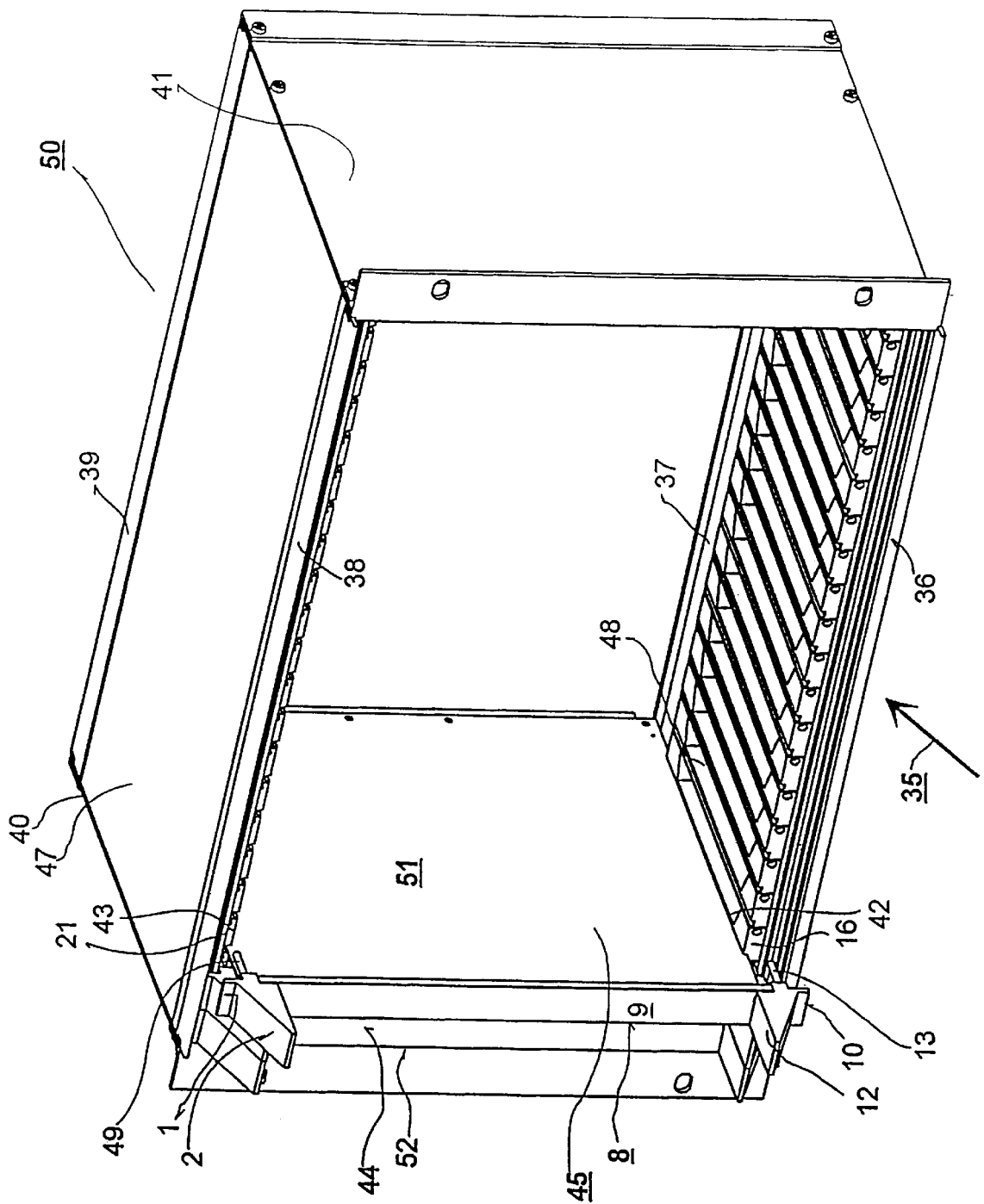
FIG. 1 shows a perspective side view of a rack system according to the invention.

In FIG. 1, part of which has already been explained above, a front element 8 and an associated printed circuit board assembly 51 of a slot 45 are, according to the invention, provided with plug-in and withdrawable centering and contact elements 13,49. These centering and contact elements project in the direction of an insertion side 35 of a mounting rack 50 and are, by way of example, mounted at a lower and upper comer part 10,1. The comer parts 10,1, in turn, are fixed to the faces of a front panel 9. The comer parts are also used to hold lower and upper lever handles 12,2. The lever handles make it easier to lever a unit, which includes the front element 8 and the printed circuit board assembly 51, in and out. The comer parts with the centering and contact elements, the front panel, and transverse connecting rails are manufactured from electrically conductive material.

The inward sides of the lower and upper transverse connecting rails 36,37 and 38, which face the slots in between them, are provided with guide rails. Each slot has an associated pair of mutually opposite guide rails, in which the edges of a printed circuit board assembly, which is located between the guide rails, are guided. In the example in FIG. 1, guide rails 42, 43 are associated with the slot 45. According to one advantageous embodiment of the invention, receiving elements are arranged next to the end faces of each printed circuit board assembly. The receiving elements are, in turn, associated with the centering and contact elements. In FIG. 1, receiving elements 16,21 are associated with the centering and contact elements 13,49 of the front element 8. These receiving elements 16,21 are advantageously integrally formed with the guide rails 42,43, which lie next to them. This will be explained in more detail below.

Figure 2:
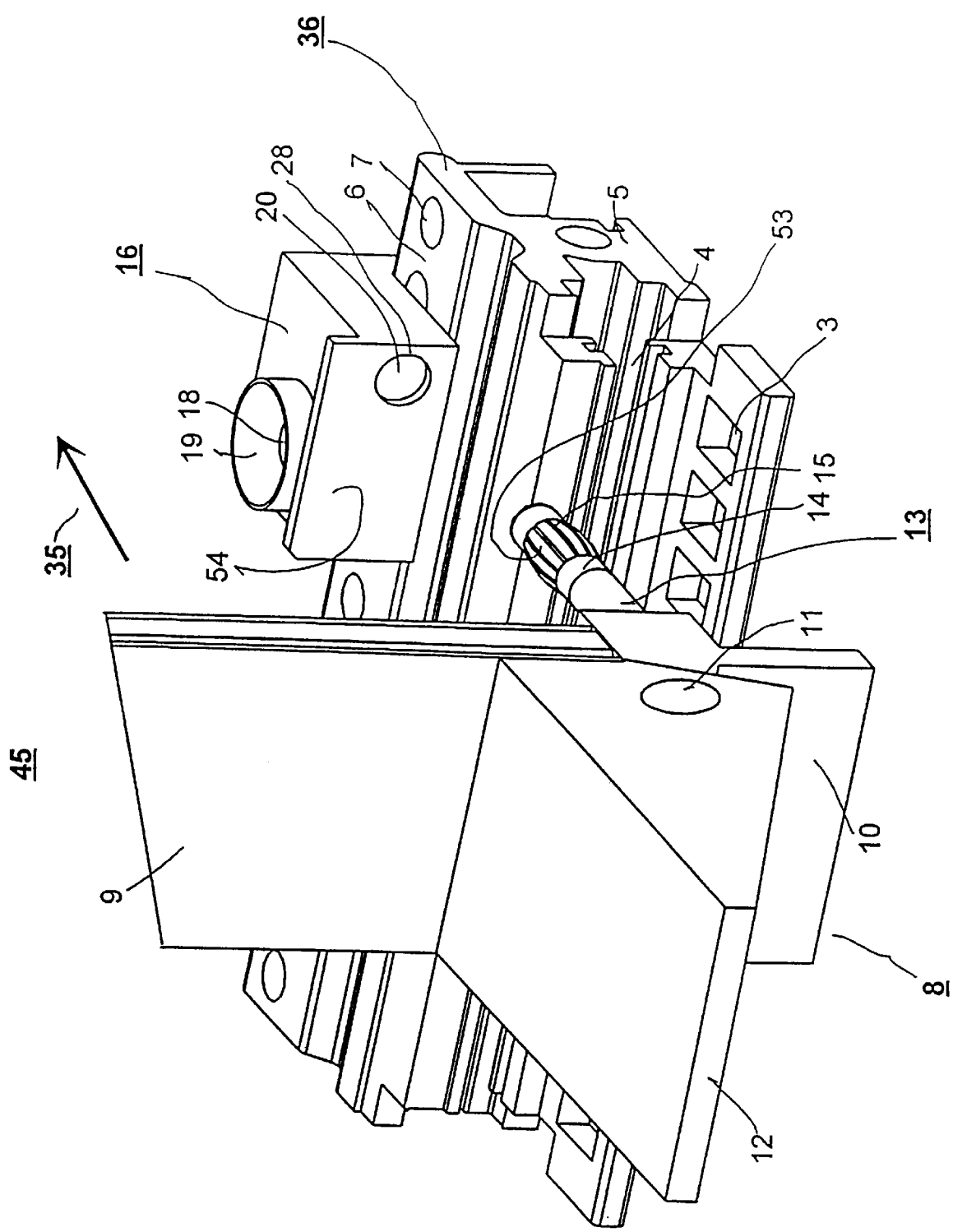
FIG. 2 shows details of a part of a lower region of a slot with a front element, a first exemplary embodiment of a receiving element, and a first exemplary embodiment of a centering and contact element.

FIG. 2 shows details of a part of a lower region of the slot 45 from FIG. 1, together with the front element 8. This front element 8 includes the front panel 9 and the end part 10 at its lower end. At the end part 10, the lever handle 12 is mounted such that it can pivot via at least one fulcrum 11.

The lever handle 12 is shown only schematically in FIG. 2. Furthermore, a centering and contact element 13, which preferably has the form of a cylindrical pin and which projects in the direction of the insertion side 35, is mounted at the end part 10. This element has an associated receiving element 16, which is advantageously designed in the form of a block and which is mounted at a contact surface 6 of the lower transverse connecting rail 36. The contact surface 6 faces the interior of the mounting rack. The transverse connecting rail 36 is conventionally designed and includes, for example underneath the insertion region, a transversely running rail. This transversely running rail has engagement openings to support elements (which are not shown in detail) of the lever handle 12. Located behind this arrangement is a transverse groove 4, into which, for example, a threaded perforated rail is inserted. Fixing screws can be screwed into the threaded perforated rail. In the example of FIG. 2, this transverse groove 4 is empty, since no fixing screws are required for the embodiment of the front element 8 according to the invention. The lower transverse connecting rail 36 is screwed, for example, to a sidewall plate 41 via a side face 5. Finally, the inner contact surface 6 is provided with a row of mounting holes 7.

In FIG. 2, the front panel 9, the end part 10, the centering and contact element 13, the transverse connecting rail 36 and the receiving element 16 are manufactured from electrically conductive material. In order to produce a permanent connection, in particular a low-impedance connection which can carry a current, the receiving element 16 is firmly connected to the transverse connecting rail 36 via a connecting element 18. A screw connection is advantageously used for this purpose, which, for example, extends via centering means 19 in the form of a funnel and through the block of the receiving element 16 into one of the mounting holes 7.

In the embodiment of the invention illustrated in FIG. 2, the receiving element 16 has a first entry opening 20 on a side 54 facing the insertion side 35 of the mounting rack 50. Furthermore, a contact cavity is located behind the first empty opening. When the front element 8 is moved in the insertion direction 35, the centering and contact element 13 enters the contact cavity. This causes a centering effect. Once the front element 8 is pushed on completely, in particular a front contact region 14 of the centering and contact element 13 is inserted into the receiving area 28 of the receiving element 16. The insertion is done in such a manner so as to provide a vibration-proof mechanical connection with a high adhesion force and a permanent, electrically low impedance connection with a high current carrying capacity between the two elements. The slot 45, which is located behind the transverse connecting rail 36 and the receiving element 16 in the insertion direction 35, is thus completely covered at the front. In the example illustrated in FIG. 1, the slot 45 is not occupied by a printed circuit board assembly, so that the front element in this case functions as a so-called blank cover.

In FIG. 2, according to a further particularly advantageous embodiment of the invention, an additional contact means 15 is provided between the centering and contact element 13 and the receiving element 16. This additional contact means 15 is, for example, associated with the centering and contact element 13 and is pushed onto the front contact region 14. Preferably, the additional contact means has the form of an approximately cylindrical basket spring 15 including outwardly pointing spring contact laminates 53. Once the centering and contact element 13 having such a basket spring is inserted into the receiving area 28 of the receiving element 16, a mechanical and electrically conductive connection is provided between the two elements. This connection has a particularly high pressure force and a particularly high current-carrying capacity.

Figure 3:
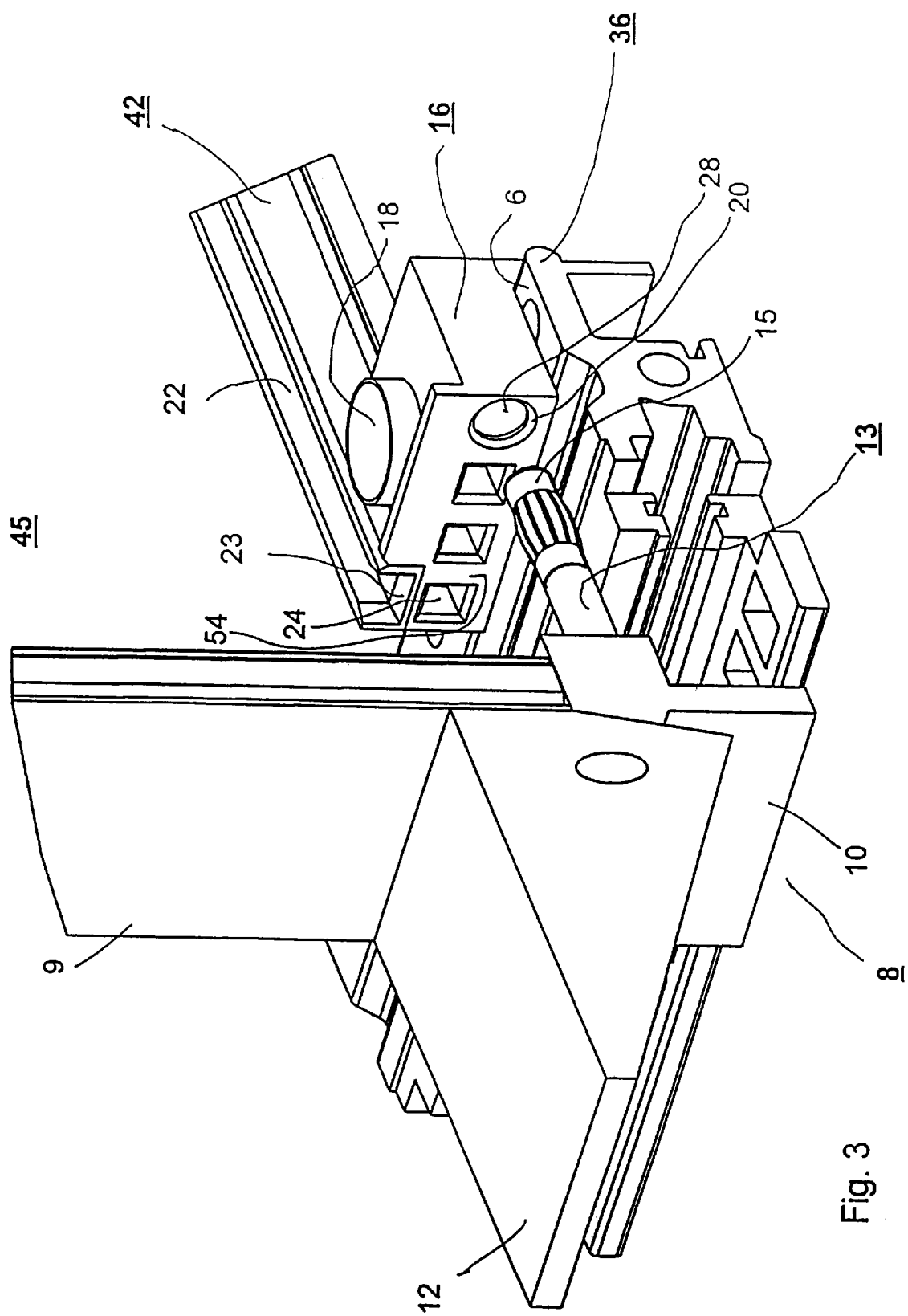
FIG. 3 shows details of a part of the slot corresponding to FIG. 2, in which, according to a further embodiment of the invention, the receiving element and a guide rail are integrally formed.

FIG. 3 shows details of the illustration of a part of the slot 45 with the front element 8, which corresponds to FIG. 2. The slot also includes the guide rails for the printed circuit board assemblies, a lower guide rail 42 of which is illustrated in FIG. 3. This lower guide rail 42 is positioned next to the receiving element 16 and mounted on the inner contact surface 6 of the lower transverse connecting rail 36. On a top surface of the lower guide rail 42, there is a U-shaped guide groove 22. Through the side edges of the printed circuit board assembly, the printed circuit board assembly is pushed and positioned into the guide groove 22 and the slot 45 via an insertion region having insertion inclines 23. At least via the end part 10, such a printed circuit board assembly is generally firmly connected to the front element 8. For reasons of clarity, no printed circuit board assembly is illustrated in FIG. 3.

In FIG. 3, according to another particularly advantageous embodiment of the invention, the guide rail 42 and the receiving element 16, which is preferably block-shaped, are integrally formed from an electrically conductive material. Thus, the single connecting element 18 establishes a permanent and electrical low-impedance connection between the unit, which includes the guide rail 42 and the receiving element 16, and the transverse connecting rail 36. The integral embodiment has the further advantage of an advantageous area subdivision on a side 54, which faces the insertion side 35 of the mounting rack 50. Thus, in the example of FIG. 3, three coding chambers 24 for coding pins are mounted next to the receiving opening 20 for the centering and contact element 13.

Figure 4:
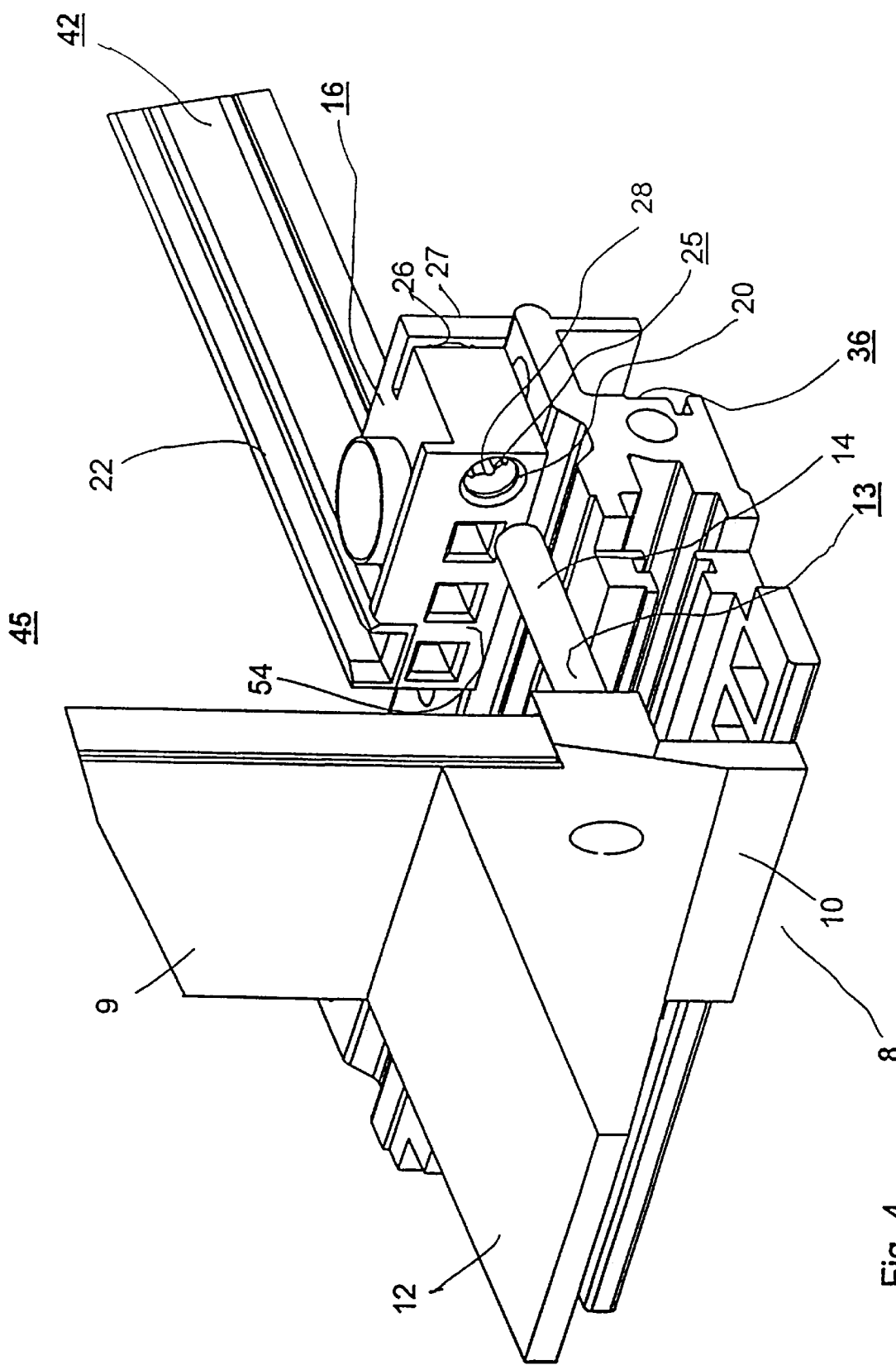
FIG. 4 shows further details of a part of the lower region of the slot with the front element, a second exemplary embodiment of the receiving element, and a second exemplary embodiment of the centering and contact element.

FIG. 4 shows a further detailed illustration of a part of the lower region of the slot 45 with the front element 8. This illustration largely corresponds to the arrangement in FIG. 3 and shows, again, an integral embodiment of the receiving element 16 and the guide rail 42. In the embodiment of FIG. 4 however, the additional contact element is associated with the receiving element 16. By way of example, the additional contact element is mounted inside a contact cavity 28, which is located behind the receiving opening 20, and has the form of a spring cage or barrel spring 25. The front contact region 14 of the centering and contact element 13 enters this receiving opening 20. On a side facing away from the insertion side 35 of the mounting rack or facing away from the front side 54, the block of the receiving element 16 advantageously has a second entry opening 27. The second entry opening 27 is preferably arranged directly opposite the first entry opening 20 and opens into the contact cavity 28. Via the second entry opening 27, the additional contact element 25, which is preferably in the form of a spring cage, is easily inserted into the contact cavity and positioned there. The first entry opening 20 may then have a smaller diameter than the contact cavity 28. The diameter of the first entry opening 20 is thus optimally matched to the external diameter of the centering and contact element 13. Furthermore, the thus narrowed first entry opening 20 provides a secure, inner contact edge for the spring cage 25, which is pushed into the extended receiving area 28 from the rear.

Preferably, the body of the receiving element 16 has a slot 26. Latching elements located at the rear end of the additional contact element 25 engage in this slot 26 so that, when the centering and contact element 13 enters the contact cavity 28, it is impossible for the additional contact element 25 to be accidentally pushed out via the second entry opening 27. This will be explained in more detail with reference to FIG. 5, below.

Figure 5:
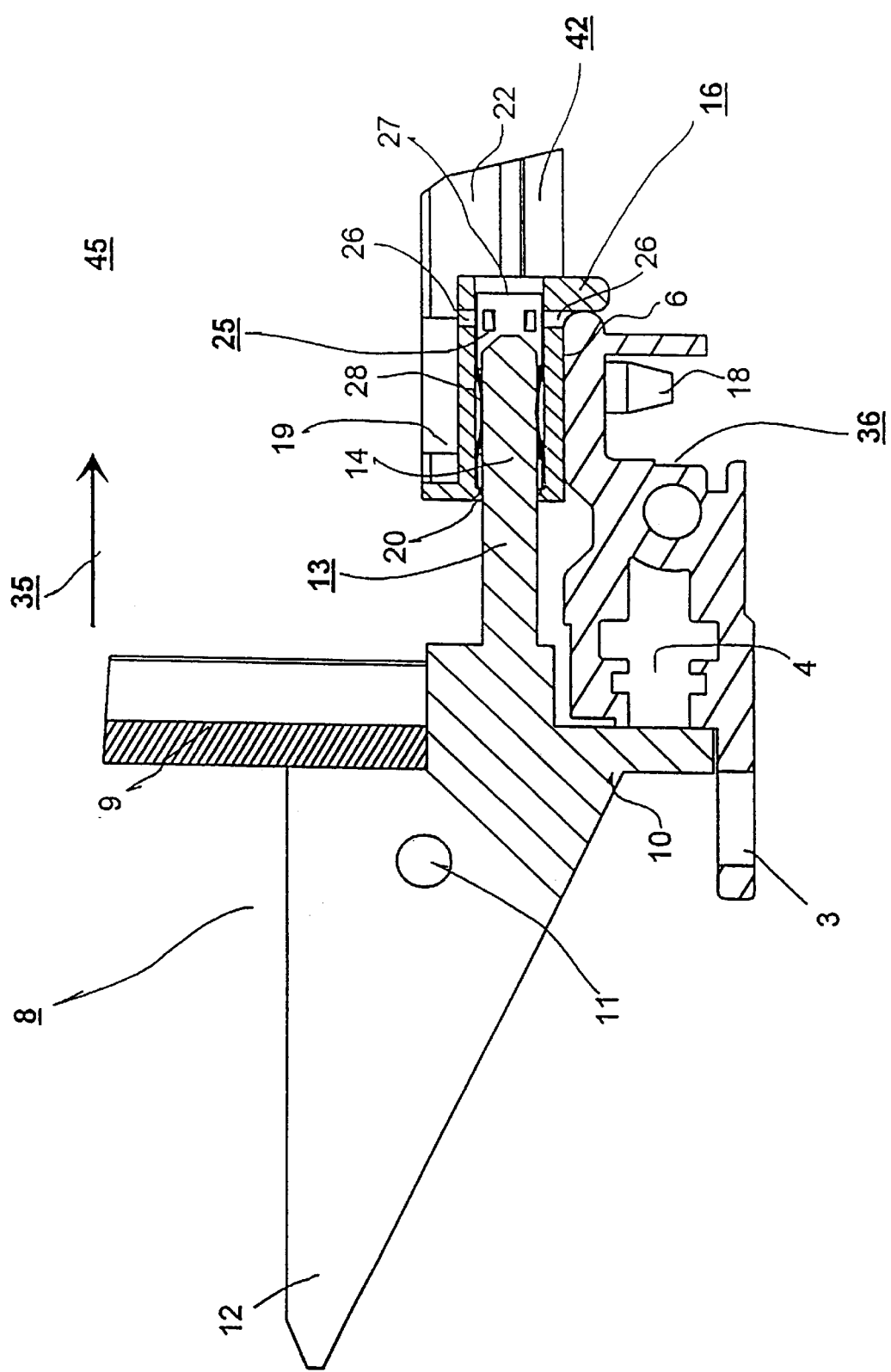
FIG. 5 shows a section illustration through the details of the part of the slot corresponding to FIG. 2.

FIG. 5 is a section representation through the detailed illustration corresponding to FIG. 4. In this case, the front element 8 is completely pushed onto the slot 45 and the transverse connecting rail 36. The centering and contact element 13 is completely inserted into the receiving area 28 of the receiving element 16, and its contact region 14 makes a highly adhesive low-impedance contact with the inserted additional contact element 25. By way of example, this contact element 25 is in the form of a spring cage, which is inserted into the contact cavity 28 from the rear via the second receiving opening 27. Additional latching elements of the spring cage 25 engage in the latching slot 26 of the receiving element 16 and effect a secure mounting.

Figure 6:
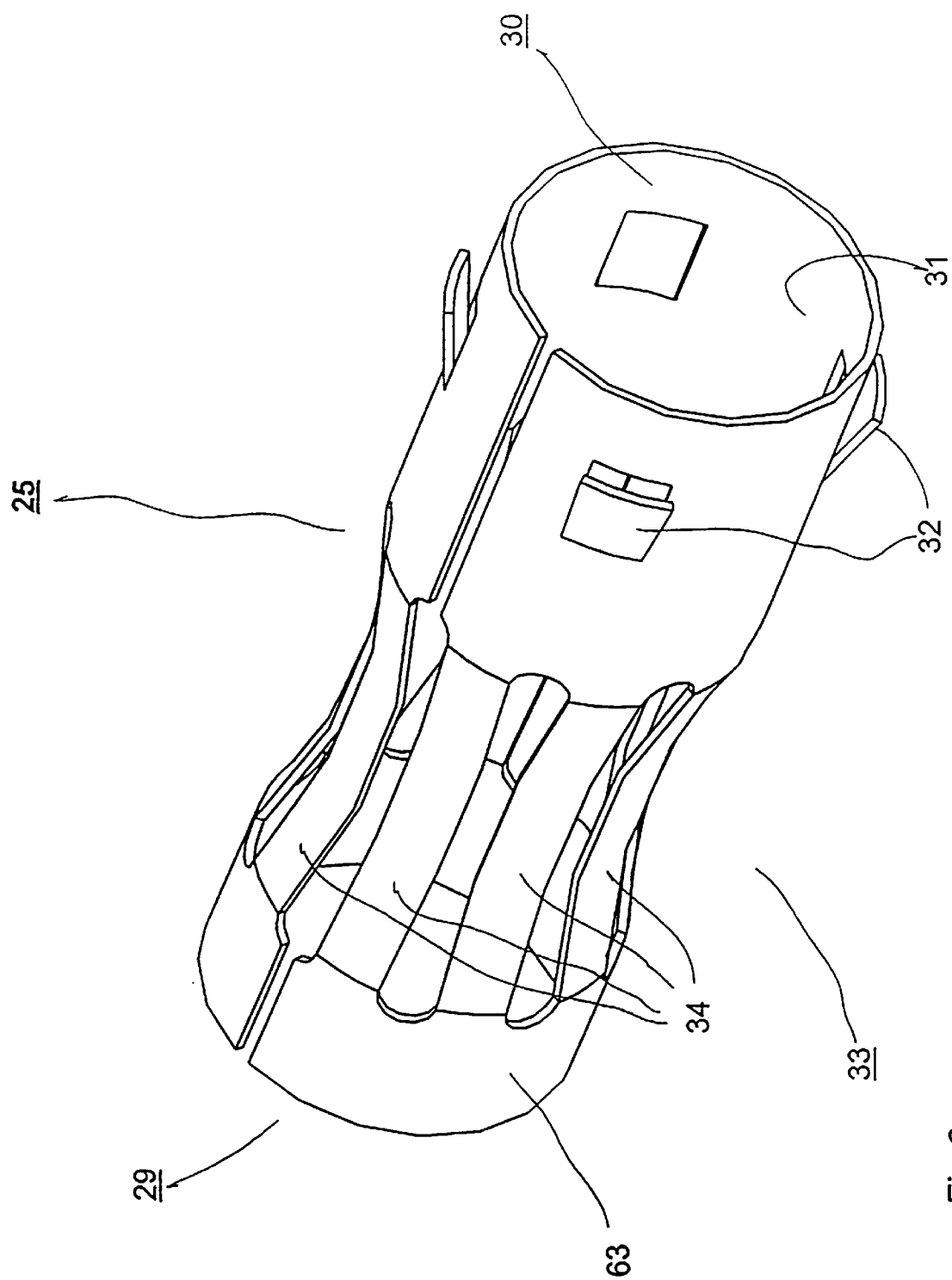
FIG. 6 shows an exemplary embodiment for an additional contact means between the receiving element and the centering and contact element, wherein the additional contact means is a spring cage, which is connected to a receiving element.

Finally, FIG. 6 shows an exemplary embodiment of an additional contact means, in the form of a spring cage, between the receiving element and the centering and contact element. Similar to the corresponding examples of FIGS. 4 and 5, the centering and contact element is connected to the receiving element 16, in particular by being mounted inside the contact cavity 28. The spring cage 25 has an approximately hollow cylindrical form. A first slotted receiving ring 63 forms a front insertion region 29 for the centering and contact element 13. At the opposite end, there is a second slotted receiving ring 30, which includes a latching region. The receiving ring 30 supports means 32, preferably in the form of spread latching claws, for latching the spring cage 25 to the receiving element 16.

A plurality of inwardly bent contact spring laminates 34 are arranged between the first slotted receiving ring 53 and the second receiving ring 30. The centering and contact element 13 is introduced into this narrowed contact cavity. In particular, the thickness of the material of the spring cage and the width of the contact spring laminates are designed such that a high contact force is exerted on the surface of the inserted centering and contact elements 13. This provides both vibration-proof mechanical contacts with a high adhesion force and an electrically low impedance contact with a high current carrying capacity.

The above description of the preferred embodiments has been given by way of example. From the disclosure given, those skilled in the art will not only understand the present invention and its attendant advantages, but will also find apparent various changes and modifications to the structures disclosed. It is sought, therefore, to cover all such changes and modifications as fall within the spirit and scope of the invention, as defined by the appended claims, and equivalents thereof.

What is claimed is:

1. A rack system, comprising:
   a mounting rack having an insertion side and slots;
   electrical printed circuit board assemblies structured to be inserted into the slots in an insertion direction from the insertion side of the mounting rack;
   opposite transverse connecting rails mounted at the mounting rack and made of electrically conductive material to bound the slots;
   receiving elements made of electrically conductive material and mounted at the transverse connecting rails at the insertion side of the mounting rack so as to provide a low-impedance contact between the receiving elements and the transverse connecting rails, wherein each of the receiving elements is associated with one of the slots; and
   plug-on and plug-off front elements made of electrically conductive material, wherein each of the front elements is associated with one of the slots and wherein each of the front elements has at least one centering and contact element, the centering and contact elements projecting in the insertion direction and being plugged into or withdrawn from a corresponding one of the receiving elements; wherein the centering and contact elements and the receiving elements are structured to be in a mechanically centered contact during an insertion process of the centering and contact elements into the receiving elements, and wherein, in a completely inserted state, the centering and contact elements and the receiving elements respectively provide a vibration-proof, highly adhesive mechanical contact and an electrically low-impedance contact with a high-current carrying capacity.

2. The rack system of claim 1, wherein the front elements further comprise at least one end part, the at least one end part being connected to the centering and contact element.

3. The rack system of claim 2, wherein the at least one end part is structured to hold one of the electrical printed circuit board assemblies.

4. The rack system of claim 1, further comprising connecting means to provide a further permanent electrical low-impedance contact between the receiving elements and at least one of the transverse connecting rails.

5. The rack system of claim 4, wherein the connecting means comprise at least one screw.

6. The rack system of claim 4, wherein the connecting means connect the receiving elements to an inner contact surface, facing the slots, of the one transverse connecting rail.

7. The rack system of claim 1, further comprising pairs of guide rails mounted respectively on the opposite transverse connecting rails, the guide rails being structured to guide the electrical printed circuit board assemblies during insertion into the slots.

8. The rack system of claim 7, wherein, in at least one of the slots, at least one of the receiving elements is arranged immediately next to one of the guide rails.

9. The rack system of claim 8, wherein, in the at least one of the slots, the at least one receiving element and the one guide rail form an integral body made of electrically conductive material.

10. The rack system of claim 1, wherein each of the receiving elements is block-shaped.

11. The rack system of claim 1, wherein each of the centering and contact elements comprises the shape of a cylindrical pin.

12. The rack system of claim 1, further comprising an additional contact assembly arranged between at least one of the receiving elements and at least one of the centering and contact elements.

13. The rack system of claim 12, wherein the additional contact assembly is connected to the at least one centering and contact element.

14. The rack system of claim 13, wherein the additional contact assembly is plugged on the at least one centering and contact element.

15. The rack system of claim 14, wherein the at least one centering and contact element comprises a front contact region onto which the additional contact assembly is plugged.

16. The rack system of claim 13, wherein the additional contact assembly comprises a barrel spring having radially outwardly pointing spring contact laminates.

17. The rack system of claim 13, wherein the at least one receiving element comprises a first entry opening facing the insertion side of the mounting rack to receive the additional contact assembly.

18. The rack system of claim 12, wherein the additional contact assembly is connected to the at least one receiving element.

19. The rack system of claim 18, wherein the receiving element comprises a first entry opening at the insertion side of the mounting rack to receive the at least one centering and contact element and wherein the additional contact assembly is arranged in a contact space behind the first entry opening in the insertion direction.

20. The rack system of claim 19, wherein the receiving element comprises a second entry opening at a side facing away from the insertion side of the mounting rack to insert the additional contact assembly into the contact space.

21. The rack system of claim 17, wherein the additional contact assembly comprises means on a side facing away from the insertion side of the mounting rack for latching the additional contact assembly to the at least one receiving element.

22. The rack system of claim 21, wherein the assembly for latching the additional contact means to the at least one receiving element comprise spread latching claws.

23. The rack system of claim 21, wherein the at least one receiving element comprises a slot to engage the means for latching the additional contact assembly to the at least one receiving element.

24. The rack system of claim 18, wherein the additional contact assembly comprises a spring cage having radially inwardly pointed spring contact laminates.

25. A rack system, comprising:

a mounting rack having transverse connecting rails and a plurality of slots;

at least one printed circuit board assembly inserted into a corresponding one of the slots;

guide rails arranged in the slots to guide the at least one printed circuit board assembly during insertion into the corresponding one of the slots;

receiving elements mounted at the transverse connecting rails, each of the receiving elements having an interior surface defining an opening;

front elements arranged in front of the slots and having respective contact elements, each of the contact elements including a projection; and at least one additional contact assembly interposed between the projection and the interior surface, wherein the projection and the at least one additional contact assembly are structured to be inserted into the opening of a respective one of the receiving elements.

26. The rack system of claim 25, wherein the projection is integral with the respective front element.

27. The rack system of claim 25, wherein the projection is a pin and wherein the additional contact assembly is a basket spring mounted on the pin.

28. The rack system of claim 25, wherein the projection is a pin and wherein the additional contact assembly is a spring cage mounted inside the opening of the respective receiving element.

* * * * *